United States Patent
Ueda et al.

(10) Patent No.: US 7,592,261 B2
(45) Date of Patent: Sep. 22, 2009

(54) METHOD FOR SUPPRESSING CHARGING OF COMPONENT IN VACUUM PROCESSING CHAMBER OF PLASMA PROCESSING SYSTEM AND PLASMA PROCESSING SYSTEM

(75) Inventors: Takehiro Ueda, Yamanashi-ken (JP); Katsuyuki Koizumi, Yamanashi-ken (JP); Kouki Suzuki, Yamanashi-ken (JP)

(73) Assignee: Tokyo Electron Limited, Tokyo (JP)

( * ) Notice: Subject to any disclaimer, the term of this patent is extended or adjusted under 35 U.S.C. 154(b) by 37 days.

(21) Appl. No.: 10/509,338

(22) PCT Filed: Mar. 27, 2003

(86) PCT No.: PCT/JP03/03770
§ 371 (c)(1),
(2), (4) Date: Oct. 8, 2004

(87) PCT Pub. No.: WO03/085715
PCT Pub. Date: Oct. 16, 2003

(65) Prior Publication Data
US 2005/0146277 A1     Jul. 7, 2005

(30) Foreign Application Priority Data
Apr. 11, 2002    (JP)   ............................. 2002-109189

(51) Int. Cl.
*H01L 21/302*     (2006.01)
*H01L 21/461*     (2006.01)

(52) U.S. Cl. ............. 438/706; 315/111.21; 315/111.81; 315/111.71; 361/234; 414/217; 156/345.32; 156/345.37; 156/345.43

(58) Field of Classification Search ................. 438/706; 315/111.21, 111.81, 111.71; 361/234; 414/217; 156/345.32, 345.37, 345.43
See application file for complete search history.

(56) References Cited

U.S. PATENT DOCUMENTS
5,625,526 A *    4/1997    Watanabe et al. ........... 361/234
(Continued)

FOREIGN PATENT DOCUMENTS
EP       0 393 637       10/1990
(Continued)

OTHER PUBLICATIONS
F. Paschen published paper (Wied. Ann., 37, 69, 1889) (p. 1).*

*Primary Examiner*—Nadine G Norton
*Assistant Examiner*—Mahmoud Dahimene
(74) *Attorney, Agent, or Firm*—Oblon, Spivak, McClelland, Maier & Neustadt, L.L.P.

(57) ABSTRACT

When the state of the vacuum processing chamber is switched to an idle state in which an insulating fluid is circulated while a semiconductor wafer W is not placed in the vacuum processing chamber and no plasma is generated in the vacuum processing chamber, nitrogen gas purging ($N_2$ purging) of the inside of the vacuum processing chamber is started, and the pressure in the vacuum processing chamber is controlled to a predetermined level, for example, about 27 Pa (200 mTorr). This makes it possible to prevent a component in the vacuum processing chamber of a plasma processor from being charged to high voltage, so that an insulative material can be protected against breakdown caused by electric discharge or the like.

11 Claims, 4 Drawing Sheets

U.S. PATENT DOCUMENTS

| | | | |
|---|---|---|---|
| 6,081,414 A * | 6/2000 | Flanigan et al. | 361/234 |
| 6,215,643 B1 * | 4/2001 | Nagasaki | 361/234 |
| 6,217,633 B1 * | 4/2001 | Ohmi et al. | 95/8 |
| 6,347,990 B1 * | 2/2002 | Sung et al. | 454/187 |
| 2001/0016157 A1 * | 8/2001 | Sundar | 414/217 |
| 2001/0016364 A1 | 8/2001 | Loan et al. | |

FOREIGN PATENT DOCUMENTS

| | | |
|---|---|---|
| JP | 11-340208 | 12/1999 |
| JP | 2001-144033 | 5/2001 |
| JP | 2002-043402 | 2/2002 |

* cited by examiner

METHOD FOR SUPPRESSING CHARGING OF COMPONENT IN VACUUM PROCESSING CHAMBER OF PLASMA PROCESSING SYSTEM AND PLASMA PROCESSING SYSTEM

TECHNICAL FIELD

The present invention relates to a plasma processor that generates plasma to perform etching or the like of a semiconductor wafer or the like and to a semiconductor device manufacturing method using the plasma processor.

BACKGROUND ART

Conventionally, plasma processors that generate plasma to apply predetermined processing to an object to be processed by the action of the plasma have been often used.

For example, in a semiconductor device manufacturing field, etching and film deposition are conducted by the action of plasma on a substrate to be processed such as a semiconductor wafer or the like when a microscopic circuit structure of a semiconductor device is to be formed.

In such a plasma processor, since plasma is generated in a vacuum processing chamber, the temperature may possibly rise due to the action of the plasma. Therefore, many plasma processors are provided with a temperature control mechanism for controlling the temperature of a predetermined portion.

For example, in a plasma processor of a so-called parallel plate type that applies high frequency power between an upper electrode and a lower electrode facing each other to generate plasma, a mounting table (susceptor) for placing a substrate to be processed such as a semiconductor wafer thereon also functions as the lower electrode. A flow path of a heat medium is formed in a block made of a conductive material (for example, aluminum or the like) which forms the lower electrode, and an insulating fluid as the heat medium, for example, a fluorinated insulating fluid is circulated in the flow path for temperature control of the semiconductor wafer or the like.

Examples of the fluorinated insulating fluid are, Fluorinert (trademark: manufactured by Sumitomo 3M) (fluorinated inert liquid composed of carbon and fluorine), GALDEN HT (trademark: manufactured by Augimont) (perfluoropolyether composed of fluorine, carbon, and oxygen), and so on. These insulating fluids have a thermal conductivity (25° C.) of about 0.06 W/mk, a volume resistivity (25° C.) of about 1E17 to 1E18 Ω-m, and a permittivity (25° C., 1 kHz) of 1.5 to 2.0.

Further, in many of plasma processors as structured above, an electrostatic chuck is provided on the block made of aluminum or the like which constitutes the aforesaid lower electrode, and the electrostatic chuck holds a semiconductor wafer or the like by suction. Such an electrostatic chuck is formed such that an electrode for electrostatic chuck is disposed in an insulating film made of an insulative material. Further, in order to achieve high efficiency and accuracy of the aforesaid temperature control of a semiconductor wafer or the like, many plasma processors have a cooling gas supply hole passing through the lower electrode and the electrostatic chuck and cooling gas such as helium is supplied to a rear surface side of the semiconductor wafer or the like from the cooling gas supply hole.

In the above-described plasma processor, if there is time before processing of a subsequent lot after the completion of processing of some lot, the processor is set on standby (idle state) to prevent particles from staying in the vacuum processing chamber and moisture from adhering to a wall surface and the like of the vacuum processing chamber so that processing can be started in a clean environment when the lot to be processed next is transferred thereto.

In such an idle state, conventionally, the vacuum processing chamber is supplied with inert gas such as nitrogen gas at a predetermined flow rate and is vacuumized while undergoing no pressure control. As a result, the pressure in the vacuum processing chamber is, for example, 5 Pa or lower.

Meanwhile, the circulation of the insulating fluid in the flow path of the lower electrode is not stopped but is continued However, if the idle state as described above continues for a long time, the circulation of the insulating fluid causes the generation of electrostatic due to friction between an inner wall of the flow path and the insulating fluid and electric charges are accumulated in the lower electrode. Further, since an upper portion and so on of the lower electrode are covered with the insulative material for electrostatic chuck, the accumulation of the electric charges results in increase in charged voltage. FIG. 6 shows the result of measuring such a time-dependent increase in charged voltage, the solid line F in FIG. 6 showing the result when the flow rate of the insulating fluid is set to 20l/minute and the solid line G showing the result when the flow rate of the insulating fluid is set to 30l/minute.

As shown in the drawing, in both cases where the flow rate of the insulating fluid was set to 20l/minute and 30l/minute, the charged voltage increased with time to reach 8000 V or higher. Further, as the flow rate of the insulating fluid was higher, the charged voltage increased in a shorter time, i.e., it took about 3 hours for the charged voltage to reach 8000 V or higher in the case of the 30l/minute flow rate while about 8 hours in the case of the 20l/minute flow rate.

For reference, the result of similar measurement of the charged voltage under varied temperatures of 0° C., 20° C., and 40° C. of the insulating fluid showed that the charged voltage becomes higher as the temperature of the insulating fluid becomes higher. This is supposed to be because lowered viscosity due to the temperature rise of the insulating fluid increases the velocity of the insulating fluid, so that an amount of electrostatic generated by the friction between the inner wall of the flow path and the insulating fluid becomes larger.

Further, it was found from a breakdown test that electric discharge occurred between the electrode of the electrostatic chuck and the lower electrode (aluminum block) at an instant when the charged voltage reached about 8000 V, which may possibly cause breakdown of the insulating film of the electrostatic chuck, as shown in FIG. 7.

Incidentally, the increase in the charged voltage as described above can be prevented by switching the potential of the lower electrode to a ground potential during the idle state, but if such a switching operation is not performed surely, there is a possibility of breakdown or the like of the insulating film of the electrostatic chuck due to the increase in the charged voltage as described above.

DISCLOSURE OF THE INVENTION

Therefore, it is an object of the present invention to provide a semiconductor device manufacturing method and a plasma processor which are capable of preventing a component in a vacuum processing chamber of the plasma processor from being charged to high voltage and protecting an insulative material against breakdown caused by electric discharge or the like.

According to the present invention, provided is a semiconductor device manufacturing method using a plasma processor, the plasma processor including: a vacuum processing chamber in which plasma is generated to plasma-process an object to be processed; a block having a flow path of a heat medium in an inner part thereof; and a component in the vacuum processing chamber disposed to be in contact with the block and made at least partly of an insulative material, and the plasma processor controlling temperature of the component in the vacuum processing chamber by circulating an insulating fluid as the heat medium in the flow path, and the method including: carrying the object to be processed into the vacuum processing chamber, generating plasma to plasma-process the object to be processed, and carrying the object to be processed that has undergone the processing out of the vacuum processing chamber; and between the processing of the object to be processed and processing of a subsequent object to be processed, circulating the insulating fluid in the flow path while the object to be processed is not in the vacuum processing chamber and no plasma is generated, and controlling pressure in the vacuum processing chamber to a predetermined pressure while supplying inert gas into the vacuum processing chamber.

A plasma processor of the present invention is a plasma processor including: a vacuum processing chamber in which plasma is generated to plasma-process an object to be processed; a block having a flow path of a heat medium in an inner part thereof; and a component in the vacuum processing chamber disposed to be in contact with the block and made at least partly of an insulative material, and the plasma processor controlling temperature of the component in the vacuum processing chamber by circulating an insulating fluid as the heat medium in the flow path, wherein, when the insulating fluid is circulated in the flow path while the object to be processed is not in the vacuum processing chamber and no plasma is generated, pressure in the vacuum processing chamber is controlled to a predetermined pressure while inert gas is supplied into the vacuum processing chamber.

The present invention is also characterized in that the insulating fluid is a fluorinated refrigerant.

The present invention is also characterized in that volume resistivity of the insulative material is $10^9$ Ω-cm or higher, and is also characterized in that the insulative material is ceramic.

The present invention is also characterized in that the component in the vacuum processing chamber is an electrostatic chuck and the block is a lower electrode made of aluminum.

The present invention is also characterized in that the vacuum processing chamber has an upper electrode disposed in parallel with the lower electrode at a position a predetermined distance away from the lower electrode, and the predetermined pressure is not lower than 0.6 times nor higher than 2.0 times a pressure that is calculated based on a minimum sparking condition of a Paschen's curve determined for each kind of the inert gas when a discharge distance is defined as the predetermined distance.

The present invention is also characterized in that the inert gas is nitrogen gas and is also characterized in that the predetermined pressure is not lower than about 13 Pa nor higher than about 40 Pa.

The present invention is also characterized in that the predetermined pressure is intermittently controlled, and is also characterized in that the intermittent pressure control is performed while a flow rate of the inert gas is varied, or the intermittent pressure control is performed by a pressure controlling device while a flow rate of the inert gas is fixed.

The present invention is also characterized in that the block is made of a conductive material.

The present invention is also characterized in that charging of the component in the vacuum processing chamber is suppressed.

BEST MODE FOR CARRYING OUT THE INVENTION

Figure 1:
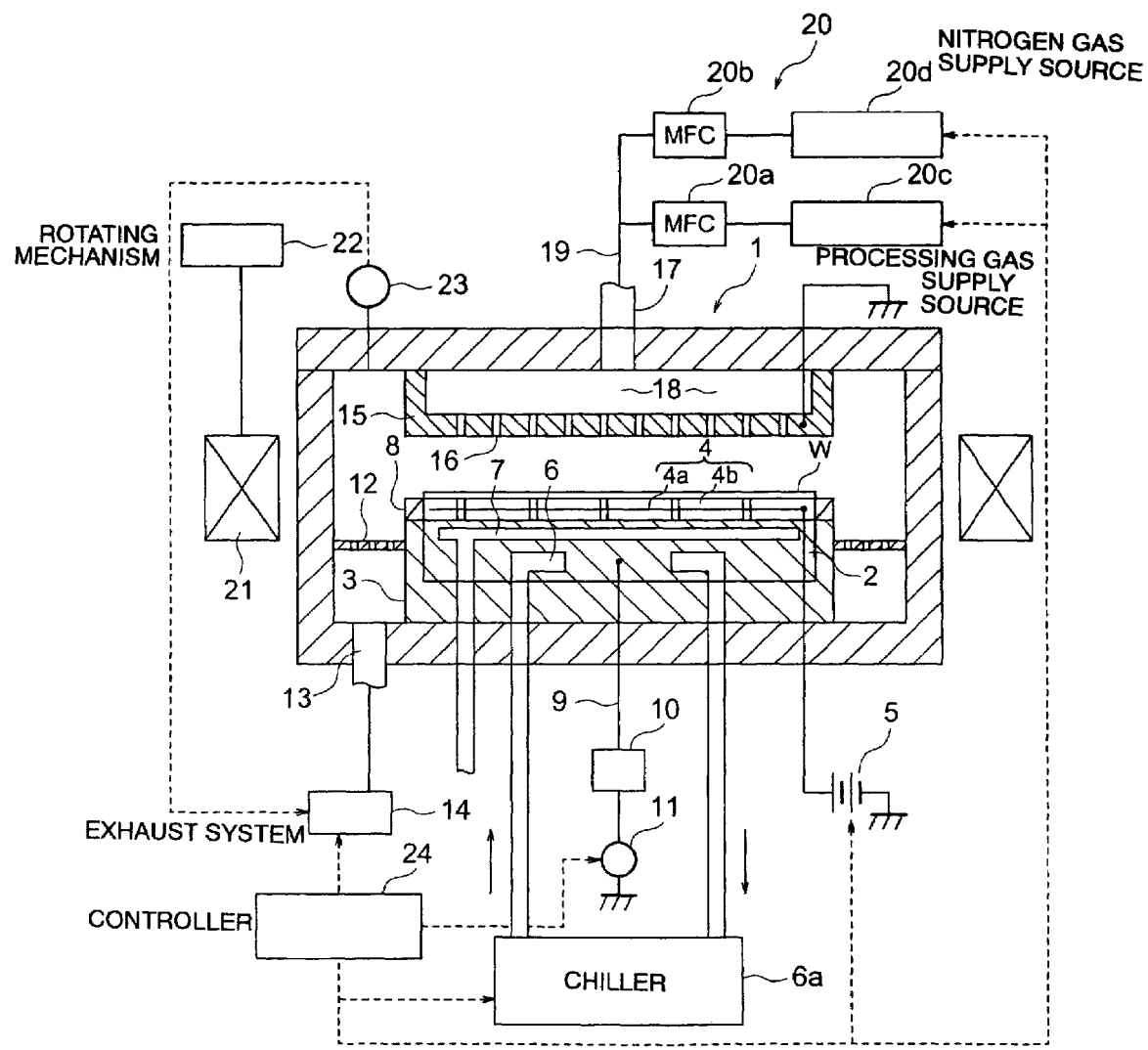
FIG. 1 is a view showing a schematic configuration of a plasma processor according to an embodiment of the present invention.

Hereinafter, an embodiment of the present invention will be described in detail with reference to the drawings. FIG. 1 schematically shows a rough structure of an entire plasma processor (etching device) according to an embodiment of the present invention. In the drawing, the reference numeral 1 denotes a cylindrical vacuum chamber made of a material, for example, aluminum or the like. The inside of the vacuum chamber 1 is airtightly closable and forms a vacuum processing chamber.

The vacuum chamber 1 is connected to a ground potential, and a block-shaped mounting table 2 made of a conductive material, for example, aluminum or the like which also functions as a lower electrode is disposed in the vacuum chamber 1.

The mounting table 2 is supported in the vacuum chamber 1 via an insulating plate 3 made of ceramic or the like, and an electrostatic chuck 4 is provided on a surface of the mounting table 2 on which a semiconductor wafer W is to be placed. The electrostatic chuck 4 is structured such that an electrode 4a for electrostatic chuck is provided in an insulating film 4b made of an insulative material, and a DC power source 5 is connected to the electrode 4a for electrostatic chuck.

The insulating film 4b of the electrostatic chuck 4 is made of a material, for example, alumina ceramic ($Al_2O_3$), and is formed by thermal spraying, sintering, or the like. The volume resistivity of the insulating film 4b in this case is about $10^9$ to $10^{14}$ Ω-cm or higher. As a material of the insulating film 4b, also usable is yttria, silicon nitride, or the like, and resin such as polyimide is also usable.

The mounting table 2 has therein a heat medium flow path 6 in which an insulating fluid as a heat medium for temperature control is circulated, and a gas flow path 7 (the area of a cross section of the flow path is 165 mm$^2$ and the length is about 5 m) for supplying temperature controlling gas such as helium gas to a rear surface of the semiconductor wafer W.

The insulating fluid controlled to a predetermined temperature is circulated from a chiller 6a into the heat medium flow path 6 at about 30l/min, thereby controlling the mounting table 2 to a predetermined temperature. Further, the temperature controlling gas is supplied between the mounting table 2 and the rear surface of the semiconductor wafer W via the gas flow path 7 to promote heat exchange therebetween, so that the semiconductor wafer W can be controlled to a predetermined temperature accurately and efficiently. As the insulating fluid, used is, for example, the aforesaid fluorinated insulating fluid (for example, Fluorinert™ (manufactured by Sumitomo 3M) (fluorinated inert liquid composed of carbon and fluorine), GALDEN HT (trademark: manufactured by Augimont) (perfluoropolyether composed of fluorine, carbon, and oxygen) or the like).

A focus ring 8 made of a conductive material or an insulative material is provided along an upper outer periphery of the mounting table 2. Further, a power supply line 9 for supplying high frequency power is connected to a substantially center of the mounting table 2. A matching box 10 and a high-frequency power source 11 are connected to the power supply line 9. The high-frequency power source 11 supplies the mounting table 2 with high frequency power having a predetermined frequency, for example, a frequency in a range of 13.56 to 150 MHz. Moreover, a ring-shaped exhaust ring 12 having a large number of exhaust holes is provided outside the focus ring 8. An exhaust system 14 connected to an exhaust port 13 vacuumizes processing space in the vacuum chamber 1 via the exhaust ring 12. Note that the exhaust system 14 is constituted of a vacuum pump for evacuation, a pressure controlling device (APC) for pressure control, and so on.

A showerhead 15 is provided on a ceiling of the vacuum chamber 1 above the mounting table 2 to face the mounting table 2 in parallel, and the showerhead 15 is grounded. Therefore, the mounting table 2 and the showerhead 15 function as a pair of electrodes (an upper electrode and a lower electrode).

The showerhead 15 has a large number of gas holes 16 formed on a bottom face thereof and also has a gas introducing portion 17 formed on an upper portion thereof. A gas dispersing space 18 is formed inside the showerhead 15. A gas supply pipe 19 is connected to the gas introducing portion 17 and a processing gas supply system 20 is connected to the other end of the gas supply pipe 19. The processing gas supply system 20 is composed of: a processing gas supply source 20c for supplying various kinds of processing gases, for example, processing gas for etching and so on; a gas supply source for supplying inert gas for purging (for example, nitrogen gas, helium gas, neon gas, argon gas, or the like), for example, a nitrogen gas supply source 20d; massflow controllers (MFC) 20a, 20b for controlling the flow rate of these gases; and so on.

Around the outer side of the vacuum chamber 1, a ring-shaped magnetic field generating mechanism (ring magnet) 21 is disposed concentrically with the vacuum chamber 1 to generate a magnetic field in the processing space between the mounting table 2 and the showerhead 15. The entire magnetic field generating mechanism 21 is rotatable around the vacuum chamber 1 by a rotating mechanism 22 at a predetermined rotation speed.

Further, the vacuum chamber 1 has a pressure gauge 23 for measuring the pressure of the inside (vacuum processing chamber) thereof. A measurement signal of the pressure gauge 23 is inputted to the pressure controlling device (APC) of the exhaust system 14 to be used for pressure control.

A controller 24 centrally controls the operations of the above-described exhaust system 14, processing gas supply system 20, chiller 6a, high-frequency power source 11, DC power source 5, and so on.

Next, an etching operation of the etching device as structured above will be described.

First, a not-shown gate valve provided in the vacuum chamber 1 is opened. Next, the semiconductor wafer W is carried into the vacuum chamber 1 via a load lock chamber (not shown) adjacent to the gate valve by a transfer mechanism (not shown) to be placed on the mounting table 2. Then, the DC power source 5 applies predetermined voltage to the electrode 4a for electrostatic chuck of the electrostatic chuck 4, so that the semiconductor wafer W is sucked by a Coulomb force. Thereafter, the gate valve is closed after the transfer mechanism retreats outside the vacuum chamber Next, the pressure control device (APC) of the exhaust system 14 controls the inner pressure of the vacuum chamber 1 while the vacuum pump of the exhaust system 14 exhausts the inside of the vacuum chamber 1 through the exhaust port 13. Then, after the inner pressure of the vacuum chamber 1 reaches a predetermined vacuum degree, the processing gas supply system 20 introduces predetermined etching gas into the vacuum chamber 1 at a predetermined flow rate, so that the inside of the vacuum chamber 1 is kept at a predetermined pressure, for example, about 1 to about 133 Pa (10 to 1000 mTorr).

Then, in this state, the high-frequency power source 11 supplies the mounting table 2 with high frequency power having a predetermined frequency (for example, 13.56 MHz).

In this case, the high frequency power is applied to the mounting table 2 functioning as the lower electrode, so that a high frequency electric field is formed in the processing space between the showerhead 15 functioning as the upper electrode and the mounting table 2 functioning as the lower electrode, and a magnetic field is generated by the magnetic field generating mechanism 21, and then etching with plasma is conducted in this state.

Then, after the execution of the predetermined etching, the supply of the high frequency power from the high-frequency power source 11 is stopped to stop the etching, and the semiconductor wafer W is carried out of the vacuum chamber 1 in a reverse procedure to the aforesaid procedure.

If there is time before processing of a subsequent lot after the completion of processing of some lot, the controller 24 sets the plasma processor on standby (idle state). This idle state is set in order to prevent particles from staying in the vacuum chamber 1 and moisture from adhering to an inner wall and the like of the vacuum chamber 1, so that processing can be started in a clean environment when the lot to be processed next is transferred thereto.

Figure 2:
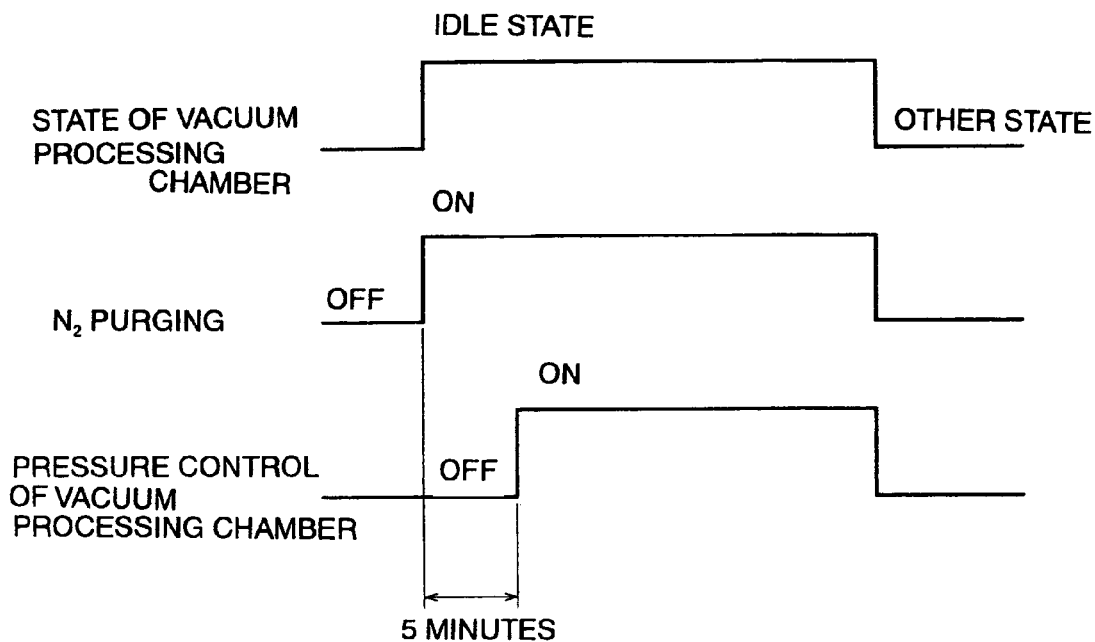
FIG. 2 is a chart showing operation timings of major portions in the plasma processor in FIG. 1

FIG. 2 is a timing chart of the control by the controller 24 when the plasma processor is set idle.

As shown in FIG. 2, when the state of the vacuum processing chamber is switched to the idle state while the semiconductor wafer W is not placed in the vacuum processing chamber (vacuum chamber 1) and no plasma is generated in the vacuum processing chamber, the nitrogen gas supply source 20d starts nitrogen gas purging ($N_2$ purging) at the same time.

In this idle state, the insulating fluid is circulated in the heat medium flow path 6 by the chiller 6a. Further, the electrode 4a of the electrostatic chuck 4 is in a state of being connected to the ground potential and the supply of the temperature controlling gas from the gas flow path 7 is in a stopped state.

Incidentally, other inert gas, for example, argon gas or the like is also usable instead of the aforesaid nitrogen gas.

Then, when five minutes have passed from the switching to the idle state, the APC of the exhaust system 14 starts pressure control of the inside of the vacuum processing chamber. This pressure control is performed so that the inside of the vacuum processing chamber comes to have a predetermined pressure of, for example, about 27 Pa (200 mTorr).

The reason why the pressure control of the inside of the vacuum processing chamber is started when five minutes have passed from the switching to the idle state is that the pressure control is started based on the expectation that the idle state will continue for a while thereafter because the idle state has continued for five minutes. However, the pressure control may be started concurrently with the switching to the idle state. Further, the pressure control maybe started when, for example, three minutes, ten minutes, fifteen minutes, or the like has passed instead of five minutes based on the relation between the increase speed of the charged voltage dependent on the circulation flow rate of the insulating fluid and the charged voltage at which dielectric breakdown of the electrostatic chuck 4 occurs.

Figure 3:
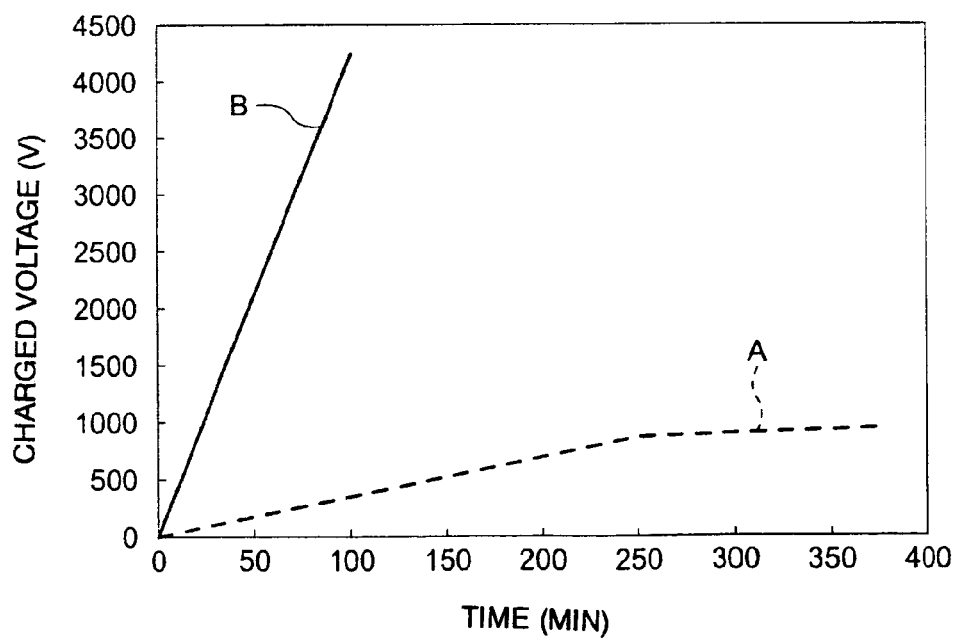
FIG. 3 is a chart showing time-dependent change of charged voltage in the embodiment as compared with that in a conventional example.

FIG. 3 comparatively shows the relation between the charged voltage of the insulating film 4b of the electrostatic chuck 4 and the time in the case where the pressure control of the inside of the vacuum-processing chamber is performed in the idle state as described above, and the relation between the charged voltage of the insulating film 4b of the electrostatic chuck 4 and the time in the case where the pressure control of the inside of the vacuum processing chamber is not performed in the idle state as in a conventional art.

In this embodiment in which the pressure control of the inside of the vacuum processing chamber is performed in the idle state, the increase in the charged voltage can be greatly inhibited as shown by the dotted line A in the drawing compared with the case, shown by the solid line B, where the pressure control of the inside of the vacuum processing chamber is not performed in the idle state. Therefore, it is possible to prevent the occurrence of dielectric breakdown in the insulating film 4b of the electrostatic chuck 4 due to the increase in the charged voltage, thereby preventing the occurrence of chipping and the like in the insulating film 4b.

Here, a possible reason why the increase in the charged voltage can be more inhibited here in the case where the pressure control of the inside of the vacuum processing chamber is performed in the idle state in the above-described manner to set the pressure inside the vacuum processing chamber to about 26.6 Pa, compared with the case where the pressure control is not performed (the pressure inside the vacuum processing chamber in this case is about 1.33 Pa) is that electric discharge occurs by the following two mechanisms.

The first supposed mechanism is that, in accordance with the increase in the pressure inside the vacuum processing chamber, the number of gas molecules entering the inside of the gas flow path 7 or the like in the aluminum block constituting the mounting table 2 becomes larger, and more electric charges are carried from the mounting table 2 by these gas molecules. The second mechanism is that electric discharge occurs between the gas flow path 7 and the showerhead 15 functioning as the upper electrode.

Figure 4:
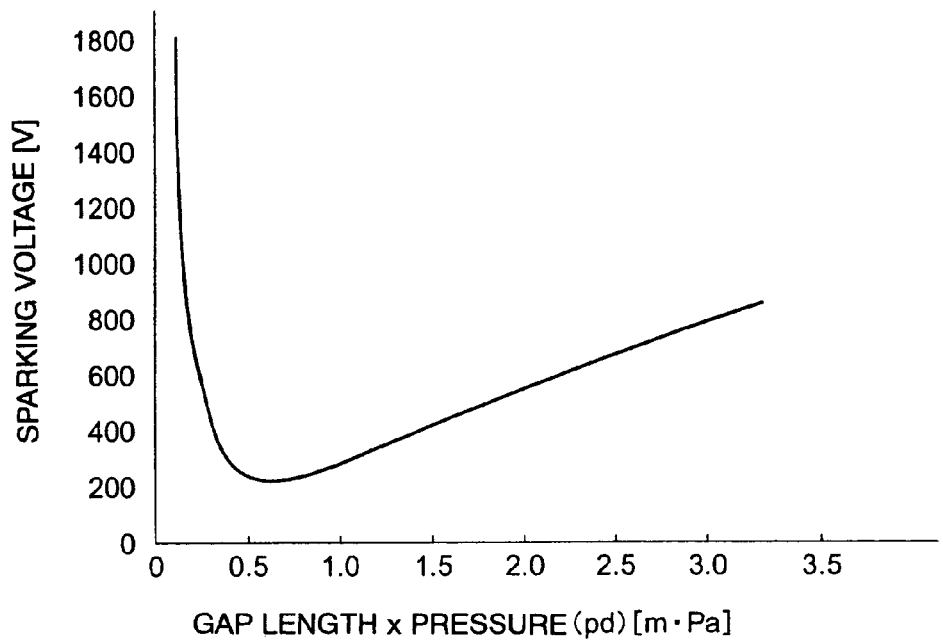
FIG. 4 is a chart showing a Paschen's curve.

Out of the above-described mechanisms, the latter one, i.e., easiness of the occurrence of the electric discharge between the gas flow path 7 and the showerhead 15 is known as showing a change represented by a curve called a Paschen's curve as shown in FIG. 4. Note that the vertical axis shows sparking voltage (V) and the horizontal axis shows a gap length×pressure (pd) (m×Pa) in FIG. 4.

When nitrogen is used as a gas species, the minimum sparking voltage is 250 V and the gap length×pressure (pd) in this case is 0.76. Further, in the plasma processor shown in FIG. 1, the gap length (the distance between the mounting table 2 (a bottom portion of the gas flow path 7) and the showerhead 15) is about 43 mm, and therefore, when the pressure is about 21 Pa (160 mTorr), the sparking voltage is 250 V which is the minimum sparking voltage, and electric discharge most easily occurs at this time according to the calculation.

Further, as is apparent from FIG. 4, the Paschen's curve presents a gentle rise as the gap length×pressure (pd) increases from a point showing the minimum sparking voltage (the lowest point of the Paschen's curve), while as it decreases, the Paschen's curve presents an abrupt rise.

When the charged voltage at each pressure was examined with the aforesaid pressure in the vacuum processing chamber being varied, an effect of suppressing the charged voltage was observed at pressures of about 4 Pa (30 mTorr) or higher, and it was possible to well suppress the charged voltage at pressures in a range of about 13 Pa (100 mTorr) to about 40 Pa (300 mTorr). Therefore, it is preferable to set the pressure in the vacuum processing chamber to about 13 Pa (100 mTorr) to about 40 Pa (300 mTorr).

The above-described pressure range corresponds to not lower than about 0.6 times nor higher than about 2.0 times the pressure corresponding to the minimum sparking voltage in the Paschen's curve. Therefore, in order to easily cause the electric discharge to well suppress the charged voltage, the pressure in the vacuum processing chamber is preferably set to not lower than about 0.6 times nor higher than about 2.0 times the pressure corresponding to the minimum sparking voltage in the Paschen's curve.

Figure 5:
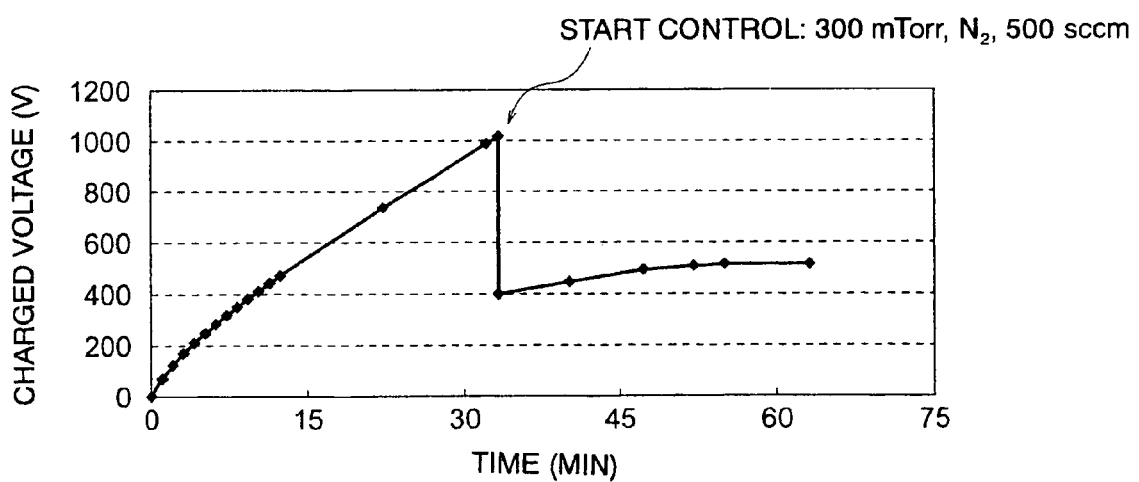
FIG. 5 is a chart showing time-dependent change of the charged voltage when pressure control is performed.

FIG. 5 shows how the charged voltage changes when nitrogen gas is supplied into the vacuum processing chamber under the controlled pressure of about 40 Pa (300 mTorr) when the vacuum chuck 4 is in a state of being charged to a certain level of high voltage by the circulation of the insulating fluid in the heat medium flow path 6 while the inside of the vacuum processing chamber is vacuumized.

As shown in FIG. 5, when the nitrogen gas is supplied into the vacuum processing chamber under the controlled pressure, the charged voltage greatly drops instantaneously and thereafter is kept substantially constant. In such changes of the charged voltage, the instantaneous drop of the charged voltage is supposed to be caused by the occurrence of electric discharge by the latter mechanism out of the aforesaid two mechanisms. Further, the substantially constant state of the charged voltage thereafter is supposed to be caused by the occurrence of electric discharge by the former mechanism.

Incidentally, when the pressure control of the inside of the vacuum processing chamber is performed in the idle state, the charged voltage, after reaching a certain value, constantly keeps this value, and does not become larger than this value, as shown by the dotted line A in the above-described FIG. 3. This value was about 740 V when the pressure was set to about 27 Pa (200 mTorr). When the pressure was set to about 13 Pa (100 mTorr) which is a lower limit in the aforesaid pressure range, this value was about 830 V, and therefore, though this value was higher than 740 V, an apparent difference in the effect was observed compared with the case where no pressure control was performed.

Further, the charged voltage was examined with the aforesaid pressure being fixed and the flow rate of the nitrogen gas being varied to 286 sccm and 714 sccm. As a result, the obtained result showed that the flow rate of the nitrogen gas gives substantially no influence to the charged voltage under the fixed pressure if the flow rate is at least within the aforesaid range. Specifically, even if the flow rate of the nitrogen gas was increased from 286 sccm to 714 sccm, substantially no difference in the effect of reducing the charged voltage was observed when the pressure was fixed. Therefore, in order to reduce a consumption amount of the nitrogen gas, the flow rate of the nitrogen gas is preferably set relatively low.

Figure 6:
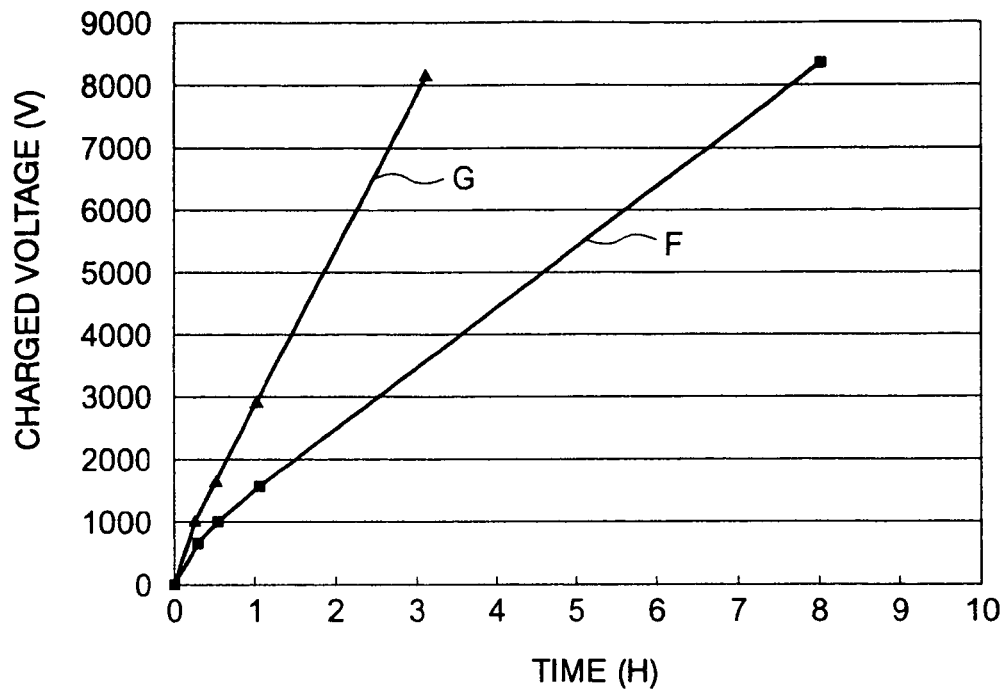
FIG. 6 is a chart showing time-dependent change of the charged voltage.
Figure 7:
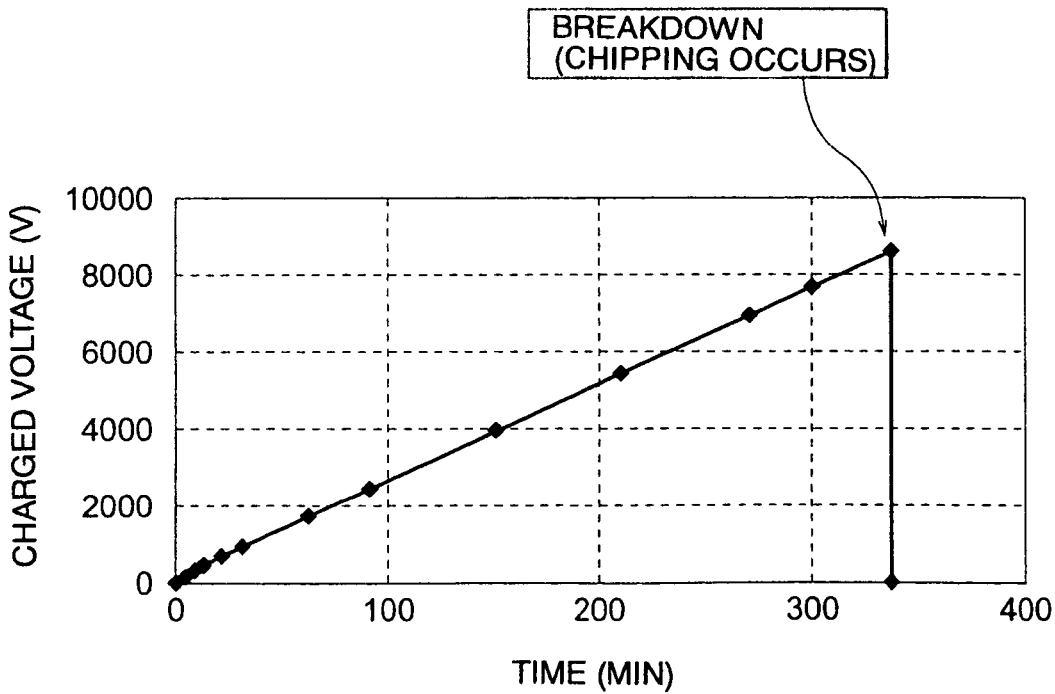
FIG. 7 is a chart showing time-dependent change of the charged voltage when a breakdown inspection is conducted.

Further, since it takes at least about one hour for the charged voltage to rise to about several thousand volts as shown in the above-described FIG. 6 and so on, the pressure control as described above may be performed intermittently instead of continuously. In such a case, the pressure control can be performed while the flow rate of the inert gas is varied or can be performed by a pressure control device while the flow rate of the inert gas is fixed. When the charged voltage is higher than a certain value, the effect of the pressure control appears in a short time as shown in FIG. 5, and therefore, the duration of the pressure control may be, for example, within one minute. Moreover, this embodiment shows the structure such that the high frequency power is applied to the mounting table 2 also functioning as the lower electrode and the DC voltage for sucking the semiconductor wafer W is applied to the electrode 4a for electrostatic chuck, but such a structure is also adoptable that superposed high frequency power and DC voltage are applied to the lower electrode and only an insulating film made of an insulative material is disposed in place of the electrostatic chuck 4.

As has been described hitherto, according to this embodiment, controlling the pressure inside the vacuum processing chamber in the idle state makes it possible to prevent the electrostatic chuck 4 being a component in the vacuum processing chamber from being charged to high voltage so that the insulating film 4b of the electrostatic chuck 4 is protected against breakdown caused by electric discharge or the like. Incidentally, in the above-described embodiment, described is the example where the present invention is applied to such a type of etching device that supplies the high frequency power only to the lower electrode, but the present invention is not limited to such a case, and is also applicable to any type of plasma processor, for example, such a type of etching device that supplies the high frequency power to both the upper electrode and the lower electrode, a plasma processor for film deposition, and the like. Further, in the above-described embodiment, the charging of the electrostatic chuck 4 is described, but it is a matter of course that the present invention is similarly applicable to components in the vacuum processing chamber other than the electrostatic chuck 4.

As described above, according to the present invention, it is possible to prevent a component in a vacuum processing chamber of a plasma processor from being charged to high voltage so that an insulative material is protected against breakdown caused by electric discharge or the like.

INDUSTRIAL APPLICABILITY

A semiconductor device manufacturing method and a plasma processor according to the present invention are usable in the semiconductor manufacturing industry which manufactures semiconductor devices, and in other fields.

Therefore it has industrial applicability.

What is claimed is:

1. A semiconductor device manufacturing method using a plasma processor, wherein said plasma processor includes:
   a vacuum processing chamber in which plasma is generated to plasma-process an object to be processed;
   a block having a flow path of a heat medium in an inner part thereof; and
   a component in the vacuum processing chamber disposed to be in contact with the block and made at least partly of an insulative material, and
   wherein said plasma processor controls a temperature of the component in the vacuum processing chamber by circulating an insulating fluid as the heat medium in the flow path, and said method comprising:
   carrying the object to be processed into the vacuum processing chamber, generating plasma to plasma-process the object to be processed, and carrying the object to be processed that has undergone the processing out of the vacuum processing chamber;
   between said processing of the object to be processed and processing of a subsequent object to be processed, circulating the insulating fluid in the flow path while the object to be processed is not in the vacuum processing chamber and no plasma is generated, and controlling pressure in the vacuum processing chamber to a predetermined pressure while supplying inert gas as a purging gas into the vacuum processing chamber; and
   determining and applying a pressure of said inert gas on a Paschen's curve so that electrical charging of the component in the vacuum processing chamber is suppressed.

2. The semiconductor device manufacturing method as set forth in claim 1, wherein the insulating fluid is a fluorinated refrigerant.

3. The semiconductor device manufacturing method as set forth in claim 1,
   wherein volume resistivity of the insulative material is $10^9$ $\Omega$-cm or higher.

4. The semiconductor device manufacturing method as set forth in claim 3,
   wherein the insulative material is ceramic.

5. The semiconductor device manufacturing method as set forth in claim 4,
   wherein the component in the vacuum processing chamber is an electrostatic chuck and the block is a lower electrode made of aluminum.

6. The semiconductor device manufacturing method as set forth in claim 5,
   wherein the vacuum processing chamber has an upper electrode disposed in parallel with the lower electrode at a position a predeteremined distance away from the lower electrode, and the predetermined pressure is not lower than 0.6 times nor higher than 2.0 times a pressure that is calculated based on a minimum sparking condition of a Paschen's curve determined for each kind of the inert gas when a discharge distance is defined as the predetermined distance.

7. The semiconductor device manufacturing method as set forth in claim 1,
   wherein the inert gas is nitrogen gas.

8. The semiconductor device manufacturing method as set forth in claim 1,
   wherein the predetermined pressure is intermittently controlled.

9. The semiconductor device manufacturing method as set forth in claim 8,
   wherein the intermittent pressure control is performed while a flow rate of the inert gas is varied.

10. The semiconductor device manufacturing method as set forth in claim 8,
    wherein the intermittent pressure control is performed by a pressure control device while a flow rate of the inert gas is fixed.

11. The semiconductor device manufacturing method as set forth in claim 1,
    wherein the block is made of a conductive material.

* * * * *